United States Patent [19]

Inushima

[11] Patent Number: 5,406,081
[45] Date of Patent: * Apr. 11, 1995

[54] INFRARED DETECTOR UTILIZING DIAMOND FILM

[75] Inventor: Takashi Inushima, Kanagawa, Japan

[73] Assignee: Semiconductor Energy Laboratory Co., Ltd., Kanagawa, Japan

[*] Notice: The portion of the term of this patent subsequent to Mar. 9, 2011 has been disclaimed.

[21] Appl. No.: 158,214

[22] Filed: Nov. 29, 1993

Related U.S. Application Data

[62] Division of Ser. No. 953,066, Sep. 29, 1992, Pat. No. 5,298,749.

[51] Int. Cl.⁶ .................. G01J 5/20; H01L 31/0256
[52] U.S. Cl. .................. 250/338.4; 257/77; 338/18; 338/22 SD
[58] Field of Search ............ 250/338.4; 257/77; 338/18, 22 SD

[56] References Cited

U.S. PATENT DOCUMENTS

| | | | |
|---|---|---|---|
| 4,151,008 | 4/1979 | Kirkpatrick | 437/19 |
| 4,350,537 | 9/1982 | Young et al. | 437/16 |
| 4,806,900 | 2/1989 | Fujimori et al. | 338/22 R |
| 4,863,529 | 9/1989 | Imar et al. | 148/33.4 |
| 4,886,571 | 12/1989 | Suzuki et al. | 156/646 |
| 4,957,591 | 2/1990 | Sato et al. | 156/643 |
| 5,051,785 | 9/1991 | Beetz, Jr. et al. | 257/77 |
| 5,089,802 | 2/1992 | Yamazaki | 338/22 SD |

FOREIGN PATENT DOCUMENTS

| 683075 | 3/1964 | Canada | 338/18 |
|---|---|---|---|

*Primary Examiner*—Constantine Hannaher
*Attorney, Agent, or Firm*—Sixbey, Friedman, Leedom & Ferguson; Gerald J. Ferguson, Jr.

[57] ABSTRACT

A detector using a diamond thin film having high response speed and sensitivity. A p-type layer may be formed in an upper portion of the diamond film by doping boron thereto. Since a sensor layer and a heat reservoir layer are united in one layer, a higher sensitivity and a higher response speed can be achieved.

12 Claims, 6 Drawing Sheets

INFRARED DETECTOR UTILIZING DIAMOND FILM

This is a Divisional application of Ser. No. 07/953,066, filed Sep. 29, 1992.

FIELD OF THE INVENTION

The present invention relates to an infrared and/or farinfrared detector utilizing a diamond film. Specifically, the detector of the present invention may belong to a new type of a bolometer.

DESCRIPTION OF THE PRIOR ART

Infrared detectors and far infrared detectors are generally classified into a thermal type and a quantum type. The former does not exhibit a wavelength dependency and is capable of operating at room temperatures while its sensitivity and response speed are not so high. On the other hand, the latter has a high sensitivity and a response speed, however, it has a wavelength dependency and also it must be kept at low temperatures.

A various types of infrared detectors of the thermal type have been known. For example, a thermocouple utilizing a thermoelectric power, a bolometer measuring a change in resistivity of a material by a temperature change, a pneumatic detector measuring a thermal expansion of a gas, and a pyroelectric sensor utilizing a ferroelectric material. In these sensors, an intensity of infrared or far infrared rays is measured in the form of a temperature increase by converting the light to heat. That is, when a detector is irradiated with light having energy "W" and produces a temperature change "Δ T", the following energy balance is established.

$$W = C \times \frac{dT}{dt} + G\Delta T \qquad (1)$$

where "C" is a heat capacity of the sensing region of the detector and "G" is a heat conductance of the sensing region of the same. When the incident light is intermittent, the energy "W" of the equation (1) is regarded as $W_0 e^{i\omega t}$. ($\omega$ is an angular frequency) and the equation (1) is expressed as follows:

$$|\Delta T| = \frac{W_0}{G(1 + \omega^2 \tau^2)}, \tau = C/G \qquad (2)$$

where $\tau$ is a time constant of the sensor. The smaller the time constant $\tau$ is, the higher the response speed of the detector is. However, the sensitivity of the device is in reverse proportion with the conductance G.

Examples of conventional detectors using the above principle are described below:

i) A Thermocouple Type Detector

A bismuth-antimony alloy is mainly used as a thermocouple and the size of it is made as small as possible in order to minimize the heat capacity. Also, in order to increase the sensitivity of the detector, it is enclosed in a hermetic seal so that the heat conductance "G" of the equation (2) can be lessened. A window made of diamond or sapphire is utilized in the hermetic seal. This type of detectors are utilized as infrared spectrophotometer.

The time constant is at best about 10 millisecond and NEP (Noise Equivalent Power) is $1 \times 10^{-10}$ W.

ii) Bolometer

Oxides of nickel or cobalt are usually utilized for bolometers. In the case of a thermistor-type bolometer, the thickness of the sensor is made as thin as possible and a light irradiated region of the detector is made as small as possible for increasing the sensitivity. The time constant of this type of detector is determined by a heat conductivity to the ambient of the detector and is currently 4 millisecond and NEP is $3 \times 10^{-8}$ W. A window is necessary in order to seal argon gas.

iii) Pneumatic-Type Goray Cell

Time constant and NEP of available detectors are 10 millisecond and not higher than $10^{-11}$ W, respectively. The operating temperature is strictly limited and the size of the device is relatively large. Mainly utilized for detecting far infrared rays.

iv) Pyroelectric-Type Ferroelectric Material Sensor

Mainly utilized for high speed FTIR (Fourier Transform Infrared Spectroscopy). TGS (tri-glycine-sulfate) or DIGS (deuterized tri-glycine-sulfate) is typically used. Time constant is on the order of millisecond and NEP is about $10^{-10}$ W. Since the pyroelectric effect is utilized, it is necessary to remove surface charges. The sensor is hermetically sealed with argon or neon gas. KBr or teflon is utilized for a window of the seal. In this type of sensor, a wavelength dependency occurs, the measuring is limited to an AC measuring, and also, the absolute intensity of light can not be measured.

As shown above, each type of the infrared detectors have problems more or less and a detector having a more improved sensitivity and a higher response speed has been needed.

SUMMARY OF THE INVENTION

It is therefore an object of the invention to provide an infrared detector having excellent properties.

Specifically, it is an object of the invention to provide an improved detector having an improved sensitivity and a higher response speed.

In order to achieve the above objects, in accordance with the present invention, a diamond is utilized because of its various properties such as transparency and thermal conductivity. Diamond has a band gap of 5.5 eV and has no infrared active mode so that it is transparent with respect to infrared and farinfrared regions. Also, diamond has a thermal conductivity up to 20 W/cm.deg. Further, Debye temperature and a specific heat of a diamond thin film are 2240K and 7 Joule/cm³.deg, respectively.

In accordance with another aspect of the present invention, a diamond thin film is doped with boron in order to control its resistivity.

The essential point of the invention is its working condition. The conventional thermistor which has the aim to detect the surrounding temperature works at thermal equilibrium condition and to attain this condition, heat transfer from surrounding media to the sensor should be fast and enough and vice versa. Therefore, the thermistor has a volume uniformity of sensing and heat dissipation.

On the contrary the sensor which I invented does not require the thermal equilibrium condition with surrounding media. This sensor works in a transient condition, especially for FTIR detector or so. The signal which is generated by FTIR spectrometer or so has the amplitude variation with different frequency and these signals are observed by the detector. Then one surface of the sensor is heated up with the frequency of the signal. This heat wave passes the sensing element with the time constant determined by heat conductance G of diamond. The detecting amplitude of the detector is given in equation (2) and heat capacity of the sensing area should be small. In the ideal case, for example, the detector is made of diamond with enough thickness and the sensing element is embedded on the surface of one side, the heat conductance is expected to be ideal value (i.e. 20 W/cm.K) and heat capacity is very small. The response time of equation (2) is in the order of $10^{-6}$ seconds and this time is not disturbed by the time constant which is determined by the thermal dissipation of the surrounding media, if the film thickness is thick enough to absorb the energy from the signal source. This condition is satisfied when the thickness ratio of the sensing region to the base diamond is not lower than 100, preferably, more than 1000.

More specifically, a surface portion of a non-doped diamond thin film is doped with a p-type impurity such as boron in order to form a p-type layer as a sensor region. Since the sensor region, and the base region are united in one film, a heat can be effectively transferred from the sensing area to the underlying non-doped diamond film without being stored in the p-type layer. Therefore, a time coefficient of the detector can be improved and a time constant on the order of $10^{-6}$ seconds can be achieved. Moreover, since only the surface portion of the diamond film functions as a detector, the heat conductance G of the equation (1) can be made as large as 20 W/cm.K and the heat capacity C can be as small as 7 $\mu$W/cm$^3$.K, and when the sensing area is $1\times 1$ mm$^2$ and sensing thickness is 0.1$\mu$m, the time constant $\tau$ can be made on the order of $10^{-6}$.

DESCRIPTION OF THE DRAWINGS

The above and other aspects of the present invention are described in conjunction with the following drawings, in which.

DESCRIPTION OF THE PREFERRED EMBODIMENTS OF THE INVENTION

EXAMPLE 1

Figure 1:
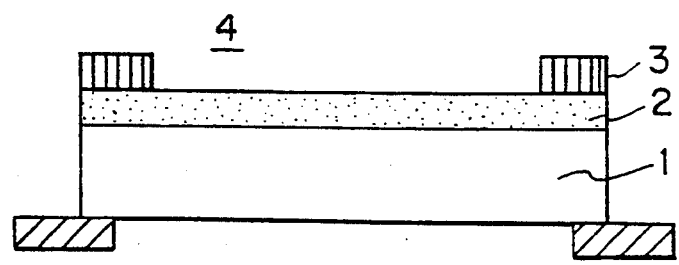
FIGS. 1 and 2 shows a schematic view of a detector in accordance with a first example of the present invention.

FIG. 1 shows a first example of an infrared detector of the invention. In this example, a diamond thin film of about 10 $\mu$m is formed on a silicon substrate by a low pressure CVD method. The thickness of the film may be selected within the range of 1 $\mu$m to 100 $\mu$m. The CVD formed diamond did not include impurities such as nitrogen and boron and therefore the diamond was substantially intrinsic and had a resistivity of $10^8$-$10^{15}$ $\Omega$cm. A whistler mode CVD using a magnetic field was employed for the deposition. The deposition conditions were: growth temperature 800° C.; pressure 0.25 Torr; microwave power 4 kW; and magnetic field strength 875 Gauss. A mixture of methanol and hydrogen gases, for example, with a ratio of $CH_3OH:H_2 = 1:4$, was utilized as a reactive gas. The deposition was performed for 32 hours and a diamond thin film having grain diameters about 5 $\mu$m was obtained. This film is severed into $5\times 5$ mm$^2$ pieces.

The thus obtained diamond thin film was placed in an ion implantation apparatus. For ion implanting boron into the diamond film, $B_2H_6$ was utilized as a material gas and B$^+$ ions were accelerated toward the surface of the film at a dose of $10^{16}$-$10^{17}$ particles/cm$^2$ with an acceleration voltage of 100 keV. At this time, it is necessary to heat the target substrate at 100°-500° C.

In such a manner, a p-type layer was formed in the surface portion of the film 1 with a depth of 1 $\mu$m or less from the top of the film. A cascade collision took place at this time. Also, the density of the inputted boron was undesirably high at the top portion of the film, which was in an amorphous form and was not semiconductive. For this reason, a sputtering with Ar gas was performed after the implantation in order to remove the surface portion (about 500 Å) of the film. Then, the film was annealed in a nitrogen atmosphere at 600° C. for 24 hours in order to activate the doped boron.

As a result, a p-type layer 2 was formed at a surface region of the diamond film with a thickness within the range of 500 Å-1000 Å. The resistivity of the p-type layer was $10^{-1}$-$10^{-5}$ $\Omega$cm and the thermistor constant B was 2000-7000. Activation energy of the p-type layer was from 0.02 to 0.37, for example about 0.1 eV.

On the p-type layer 2, a metal layer such as Au was formed as electrodes 3 by sputtering. The diameter of the metal layer was about 1 mm.

Then, the diamond film was removed from the silicon substrate by using alcohol and wiring was performed to the electrodes. (not shown)

Thus an infrared detector 4 was obtained.

Figure 4:
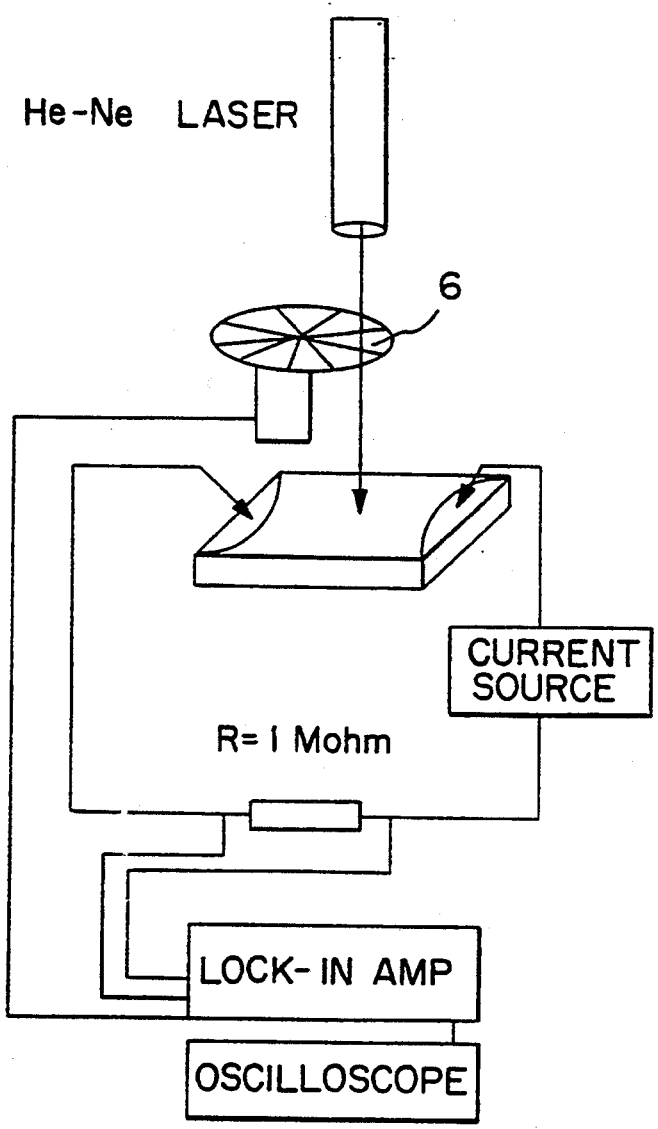
FIG. 4 shows a circuitry for measuring response of the detectors in accordance with the present invention.

In order to investigate the properties of the detector obtained in this example, a photoresponse of the detector was measured using a measurement circuitry shown in FIG. 4. Namely, a laser beam was emitted onto the detector 4 intermittently through a chopper 8 and a voltage induced across a 1M$\Omega$ resistor was observed by an oscilloscope.

Figure 2:
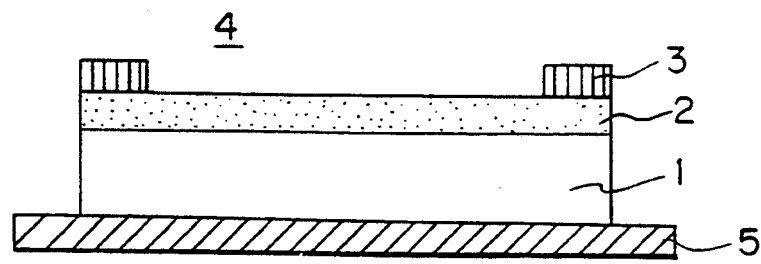
Figure 5:
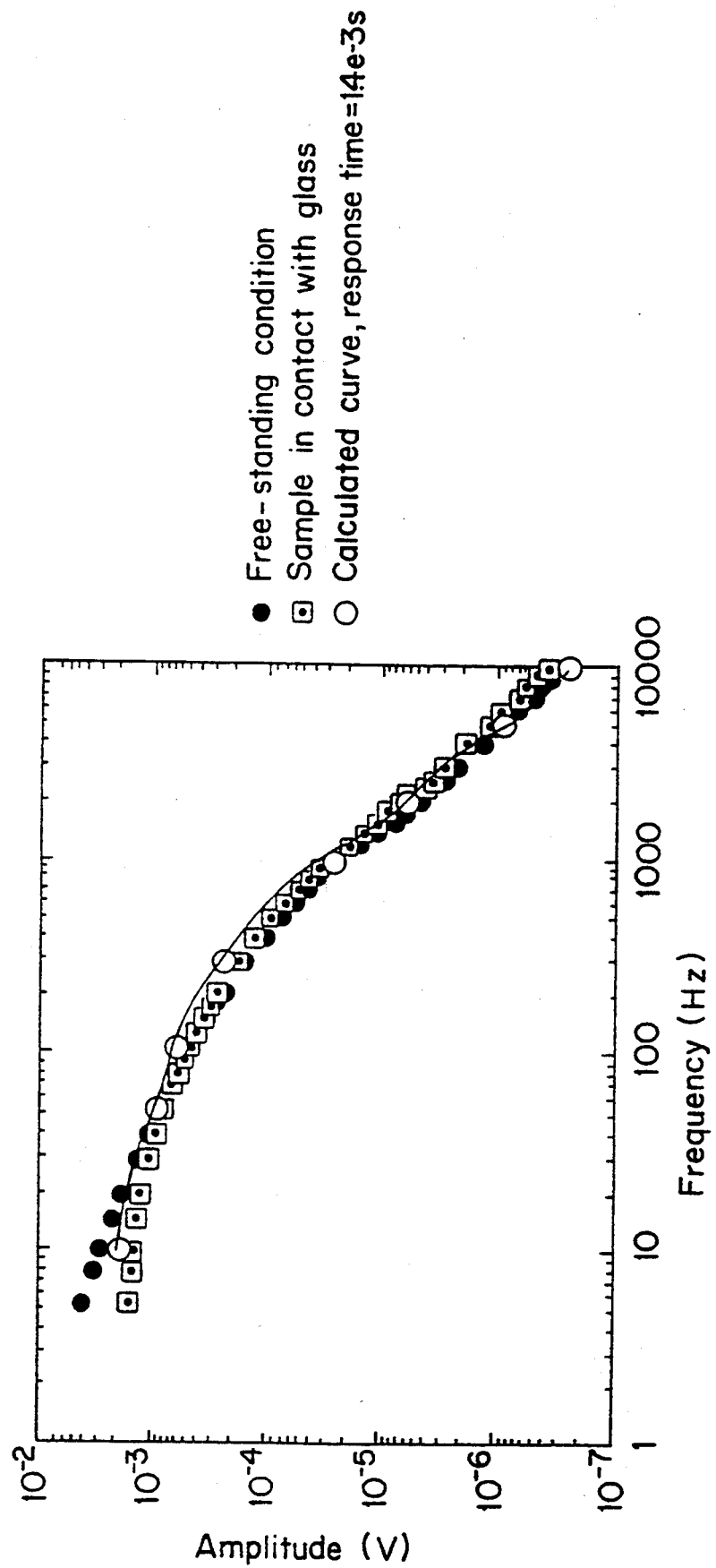
FIG. 5 shows a photoresponse of the detectors in accordance with the present invention.

This experiment was performed on the detector which was maintained in the air by supporting end portions of the detector as shown in FIG. 1 and another one which was supported on a glass substrate 5 as shown in FIG. 2. The glass substrate functions as a heat receiver. The results are shown in FIG. 5. The symbol "●" corresponds to a data of the former while the symbol "□" corresponds to a data of the latter.

As can be seen from the diagram shown in FIG. 5, there is no apparent difference in the amplitude of the detectors between the above two cases. A time constant $\tau = 1.4$ m sec was obtained from the equation (2). (the solid line in the diagram) This can be improved by one order by using more thin wiring or electrodes or employing a blackening layer (as explained later).

Figure 6A:
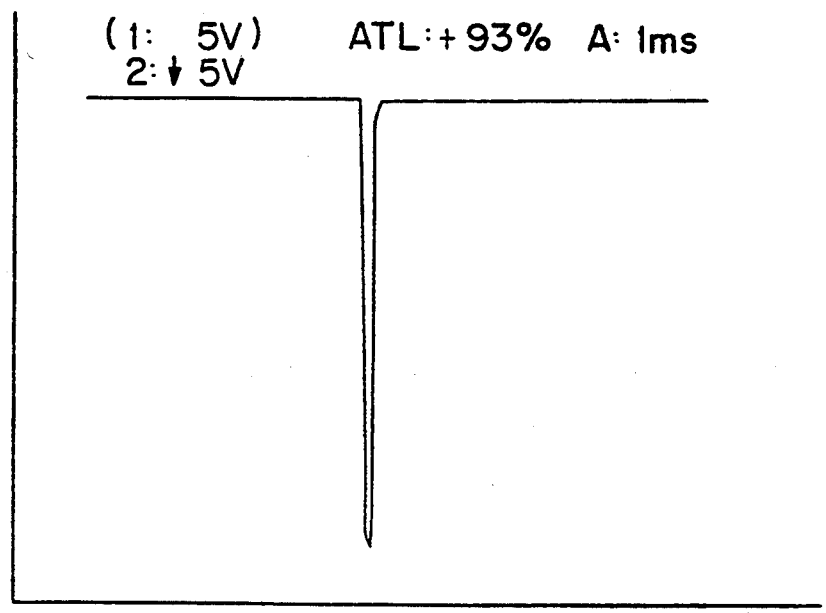
FIGS. 6(A) through 6(E) show response waveforms of the detectors of the present invention in response to an incident pulse.

FIGS. 6(B) through 6(E) show transient responses of the detector with respect to a strobe flash. For this experiment, the He—Ne laser shown in FIG. 4 is replaced by a strobe used in a photography. FIG. 6(A) shows a waveform of the strobe flash measured by a high speed photocell. It is observed from FIG. 6(A) that the rise up time of the strobe flash was 0.1 m second and the pulse width thereof was 0.2 m sec.

Figure 6B:
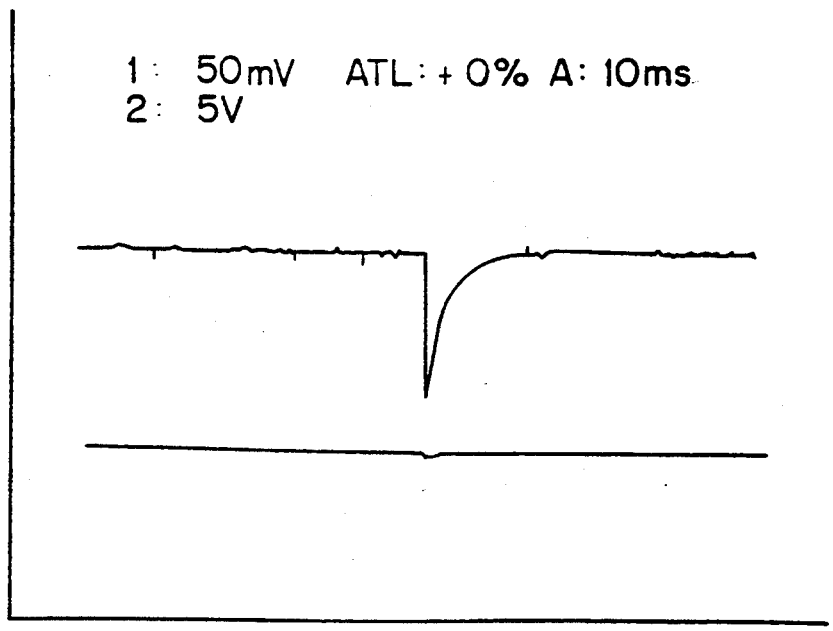
Figure 6C:
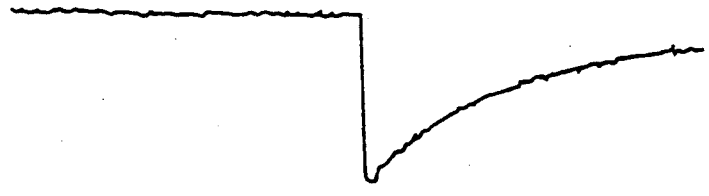
Figure 6D:
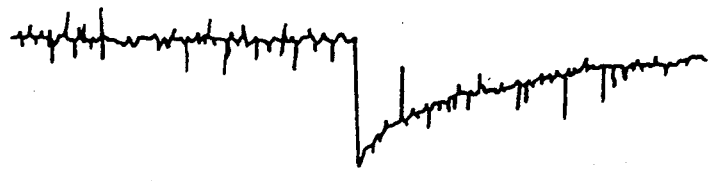

The transient responses with respect to this light are shown in FIGS. 6(B) through 6(E). FIG. 6(B) shows the response waveform of the detector which is located on the glass substrate 5 in response to the flash light shown in FIG. 6(A) while FIG. 6(D) corresponds to the detector where a glass substrate is not utilized and only the end portions are supported. FIGS. 6(C) and (E) shows diagrams in which time axes of FIGS. 6(B) and (D) are extended by 10 times, respectively.

In the case that the detector was located on the glass substrate, the rise up time was as high as that of the strobe flash. Therefore, it is concluded that the detector has a response speed on the order of microsecond. In the case that the detector was not located on the glass substrate, the rise up time was almost the same as that of the former case.

Figure 6E:
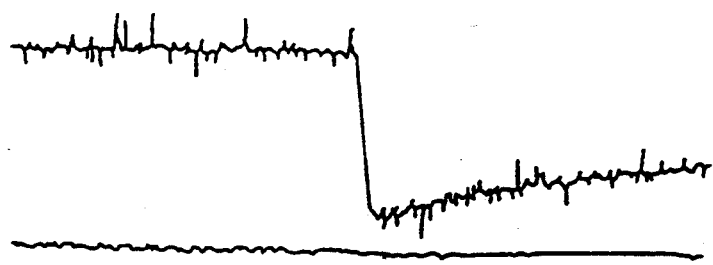

However, there was a remarkable difference in the fall time of the detector between the above two cases. As shown in FIG. 6(C), it took about 5 msec to fall back to the initial state in the case that a glass substrate was utilized. On the other hand, the fall time in the latter case was about 10 msec as shown in FIG. 6(E). This means that if the detector is used for detecting light repeatedly it is necessary to effectively release heat absorbed by the detector to outside through the substrate or the like. It is possible to utilize more appropriate materials as the substrate, for example, sapphire, diamond, aluminum, copper, etc. in order to effect the release of the heat.

EXAMPLE 2

Figure 3:
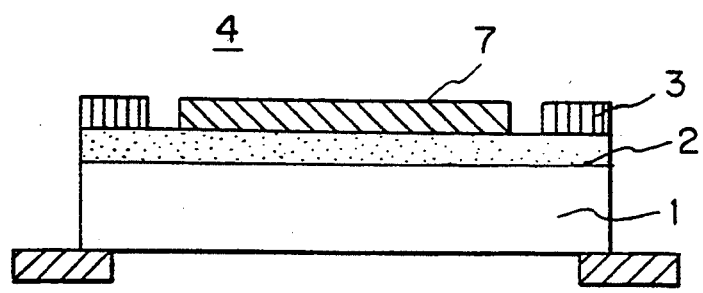
FIG. 3 shows a schematic view of a detector in accordance with a second example of the present invention.

FIG. 3 shows a second example in accordance with the present invention.

The process for forming the detector 4 was the same as that of Example 1 except for the provision of a blackening layer explained below.

After the formation of the p-type layer 2 as explained above, a film 7 was further formed on the thus formed p-type diamond layer 2. The film 7 is for absorbing infrared rays and converting them to heat so that this film is required not to have a wavelength dependency and be substantially a blackbody. In this example, the film 1 was formed by evaporating Au in an atmosphere in which a $N_2$ pressure was 1-2 mm Hg. The film thickness was not higher than 1 $\mu$m. Other materials such as carbon black may be utilized instead of the Au—N material.

The detector in accordance with the present invention can be also utilized for a gas chromatography because of the high response speed and sensitivity. In this case, the detector is reliable with respect to various kinds of corrosive gases.

While this invention has been described above in connection with the foregoing examples, it is understood that persons of skill in the art can make numerous modifications without departing from the scope of the invention as claimed in the appended claims.

What is claimed is:

1. A detector comprising:
   a diamond film formed on a substrate comprising a material selected from the group consisting of sapphire, diamond, aluminum and copper, said film having a boron doped region in a surface region thereof;
   a pair of electrodes formed on said diamond film with said boron doped region therebetween; and
   a blackening layer formed on said boron doped region.

2. A detector comprising:
   a diamond film including an impurity doped region formed in a surface region of said diamond film; and
   electrodes formed on said impurity doped region wherein said impurity doped region continuously extends between said electrodes, and wherein said detector is operated in a thermally non-equilibrium condition with an outside media.

3. The detector of claim 2 wherein said diamond thin film has substantially intrinsic conductivity type.

4. The detector of claim 2 wherein said impurity is boron.

5. The detector of claim 2 wherein said impurity doped region is a p-type semiconductor layer.

6. The detector of claim 5 wherein said p-type semiconductor layer has a thickness of 500-1000Å.

7. The detector of claim 5 wherein said impurity doped region has an activation energy of 0.02-0.37 eV.

8. The detector of claim 2 wherein said impurity doped region has a resistivity of $10^{-1}$-$10^{-5}$ Ωcm.

9. The detector of claim 2 wherein said diamond film has a thickness of 1-100 $\mu$m.

10. A detector comprising:
    a diamond film having a first surface and a second surface opposite to said first surface wherein said diamond film is doped with an impurity in a surface region thereof having said first surface;
    a pair of electrodes formed on said first surface of the diamond film,
    wherein said second surface is exposed to an outside atmosphere.

11. The detector of claim 10 wherein said diamond film is supported by a substrate.

12. The detector of claim 11 wherein said substrate comprises a material selected from the group consisting of sapphire, diamond, aluminum and copper.

* * * * *